United States Patent
Schmid et al.

(10) Patent No.: US 8,349,637 B2
(45) Date of Patent: Jan. 8, 2013

(54) METHOD FOR THE MANUFACTURE OF A SOLAR CELL AND THE RESULTING SOLAR CELL

(75) Inventors: Christian Schmid, Freudenstadt (DE); Dirk Habermann, Kirchzarten (DE)

(73) Assignee: Gebr. Schmid GmbH & Co. (DE)

( * ) Notice: Subject to any disclaimer, the term of this patent is extended or adjusted under 35 U.S.C. 154(b) by 479 days.

(21) Appl. No.: 12/554,592

(22) Filed: Sep. 4, 2009

(65) Prior Publication Data

US 2010/0012185 A1      Jan. 21, 2010

Related U.S. Application Data

(63) Continuation of application No. PCT/EP2008/001500, filed on Feb. 26, 2008.

(30) Foreign Application Priority Data

Mar. 8, 2007  (DE) ................ 10 2007 012 277

(51) Int. Cl.
  *H01L 21/00*  (2006.01)
  *H01L 31/04*  (2006.01)
(52) U.S. Cl. ........ 438/57; 438/69; 438/98; 257/E27.123
(58) Field of Classification Search ............ 438/57, 438/69, 72, 98
  See application file for complete search history.

(56) References Cited

U.S. PATENT DOCUMENTS

| | | | |
|---|---|---|---|
| 4,463,216 A | 7/1984 | Nakano et al. | |
| 4,703,553 A | 11/1987 | Mardesich | |
| 6,081,017 A | 6/2000 | Kim et al. | |
| 6,695,903 B1 | 2/2004 | Kubelbeck et al. | |
| 7,495,167 B2 | 2/2009 | Joge et al. | |
| 2004/0003836 A1 | 1/2004 | Watsuji et al. | |
| 2005/0252544 A1 | 11/2005 | Rohatgi et al. | |
| 2007/0221270 A1 | 9/2007 | Watsuji et al. | |

FOREIGN PATENT DOCUMENTS

| | | |
|---|---|---|
| DE | 3815512 A1 | 11/1989 |
| EP | 0735597 A2 | 10/1996 |
| JP | 2004-6565 A | 1/2001 |
| JP | 2006-339499 A | 12/2006 |

OTHER PUBLICATIONS

Search Report issued in connection with corresponding Taiwanese Patent Application No. 097108237.

*Primary Examiner* — Alexander Ghyka
(74) *Attorney, Agent, or Firm* — Akerman Senterfitt

(57) ABSTRACT

In a method for the production of a solar cell, a flat aluminium layer is applied to the back of a solar cell substrate. The aluminium is alloyed into the silicon substrate by the effect of the temperature and forms an aluminium BSF. The remaining aluminium that has not been alloyed into the silicon is subsequently removed. The aluminium BSF is transparent to light.

15 Claims, 1 Drawing Sheet

METHOD FOR THE MANUFACTURE OF A SOLAR CELL AND THE RESULTING SOLAR CELL

FIELD OF APPLICATION AND PRIOR ART

The invention relates to a method for the manufacture of a solar cell with a BSF coating (back surface field), said solar cell advantageously comprising silicon or a silicon substrate, as well as a solar cell manufactured using such a method.

The manufacture of a conventional solar cell involves a sequence of process steps, described in summary form hereinafter. The basis is usually provided by mono-crystalline or polycrystalfine p-Si wafers, which are surface-textured by means of an etching process to improve the absorption properties. In the case of mono-crystalline silicon said etching process is performed with a mixture of sodium or potassium hydroxide solution with isopropyl alcohol. Polycrystalline silicon is etched with a solution of hydrofluoric and nitric acid. Further etching-cleaning sequences are then performed in order to provide an optimum preparation of the surface for the following diffusion process. In said process a p-n junction in silicon is produced by the diffusion of phosphorus in a depth of approximately 0.5 µm. The p-n junction separates the charge carriers formed by light. For producing the p-n junction the wafer is heated to approximately 800° C. to 950° C. in a furnace in the presence of a phosphorus source, usually a gas mixture or an aqueous solution. The phosphorus penetrates the silicon surface. The phosphorus-doped coating is negatively conductive as opposed to the positively conductive boron-doped base. In this process a phosphorus glass is formed on the surface and is removed in the following steps by etching with HF. Subsequently to the silicon surface is applied a roughly 80 nm thick coating, usually comprising SiN:H, in order to reduce reflection and for passivation. Metallic contacts are then applied to the front side (silver) and back side (gold or silver). In order to produce a so-called BSF (back surface field), advantageously of aluminium, in said process part of the aluminium applied to the wafer back surface is alloyed into the silicon in the following firing step.

PROBLEM AND SOLUTION

The problem of the invention is to provide an aforementioned method and a solar cell manufactured therewith, which are able to avoid the disadvantages of the prior art and where in particular the efficiency of a solar cell can be further increased.

This problem is solved by the features set forth in claim 1. Advantageous and preferred developments form the subject matter of the further claims and are explained in greater detail hereinafter. By express reference the wording of the claims is made into the content of the present description.

According to the invention a BSF coating is applied to the back side of a solar cell substrate, more particularly comprising silicon, in a way that firstly aluminium or a TCO is applied to the substrate. Subsequently aluminium or part thereof is alloyed into the substrate and the resulting BSF coating is transparent or does not give rise to shading. The advantage of this manufacturing method and the BSF produced therewith is that it is also possible to produce bilateral or so-called bifacial solar cells, which can also be irradiated from the back, without the BSF giving rise to shading. In particular, in this way both large-area and also small or local BSF can be created. It is also possible to use different application processes for the aluminium or TCO and these will be described hereinafter. Finally, such a method is relatively favourable and as a result favourable cells can be produced compared with other highly efficient solar cells. Through the use of aluminium in place of boron for the BSF, a much more favourable and easily controllable process can be used, inter alia in that the alloying temperature for aluminium is much lower than for boron and is in particular less than 900° C. Thus, for example also multi-crystalline silicon can be used, which would be dlsadvantageously modified in the case of alloying in with boron due to the high temperatures of well above 1000° C.

In a development of the invention aluminium or TCO can be applied in punctiform or small area form to the substrate or a back surface of the substrate. Thus, several BSF can be produced in punctiform manner or as small areas. Advantageously these points or small areas are located along lines, which in particular have the same spacing. They are preferably applied in the manner of a uniform grid or raster, so that a uniform electrical contacting on the BSF is possible. On the BSF or the small areas and in particular along said lines, metallic contacts are subsequently applied, for example of nickel or silver or combinations thereof.

In a somewhat different development of the invention the application of aluminium to the substrate and therefore the production of a BSF or conductive areas for the BSF can take place in the manner of the above-described lines. Here again it is advantageous if the lines are parallel to and have the same spacing from one another.

In yet another modified development of the invention aluminium can be applied in a real or large-area manner to the back side of the substrate and can in particular cover the entire back side. It is admittedly fundamentally possible here to provide different coating thicknesses or coating thickness gradients, but advantageously a roughly uniformly thick coating is applied. As in the case of the above-described, linearly applied aluminium, here again with the production of a linear aluminium-BSF, in a following step metallic contacts can be applied and once again in particular linear metallic contacts.

There are numerous possibilities for applying aluminium to the substrate. In one possibility it can be applied by a screen printing process or ink jet process, it can also be applied in liquid or pasty form, for example as aluminium-containing liquid or aluminium-containing gel. According to another possibility, in much the same way as other metal coatings, aluminium can be applied by sputtering, vaporizing, CVD processes or alloying.

A heating process can be provided for alloying the aluminium into the substrate or the substrate silicon material. This advantageously differs from the heating used or occurring for the preceding application of aluminium. In this way the process can be better controlled or optimized for its intended purpose.

Following the alloying of aluminium into the substrate or silicon material, part of the remaining aluminium is removed, in particular, only that aluminium is removed which has not been alloyed into the substrate or which is still pure aluminium and therefore forms its own or a coating that can be differentiated. Said unalloyed aluminium can either be completely removed or, for example in order to permit a better subsequent electrical contacting and the application of electrical contacts, is only partly removed or left in linear form. If is alternatively possible to remove all the unalloyed aluminium. Advantageously the aluminium is removed by etching, as is known per se.

In a development of the inventive method, following aluminium removal there can be a passivation at least of the back side of the substrate. Advantageously an antireflection coating is applied, at least to the back of the substrate. This is particularly advantageous if the back of the solar cell is also to be irradiated with light.

Following the above-described removal or partial removal of aluminium, it is possible when manufacturing the solar cell to produce a p-n junction on the substrate, by diffusing phosphorus into n-silicon.

It is also possible, particularly for a subsequent building up of electrical contacting on the back of the substrate, to apply metal or aluminium in prefabricated structures on the substrate. Such structures are especially produced on an above-described antireflection coating, said production taking place mechanically or for example by laser machining. In the resulting trenches it is possible to introduce aluminium, advantageously in the above-described linear form, more particularly to an underlying aluminium-BSF. The latter aluminium is then not removed. Advantageously to this is applied a back, very good conducting, electrical contact in linear form, particularly as a silver contact.

These and further features can be gathered from the claims, description and drawings and the individual features, both singly or in the form of subcombinations, can be implemented in an embodiment of the invention and in other fields and can represent advantageous, independently protectable constructions for which protection is claimed here. The subdivision of the application into individual sections and the subheadings in no way restrict the general validity of the statements made thereunder.

BRIEF DESCRIPTION OF THE DRAWINGS

Embodiments of the invention are described hereinafter relative to the attached diagrammatic drawings, wherein show.

DETAILED DESCRIPTION OF THE EMBODIMENTS

Figure 1:
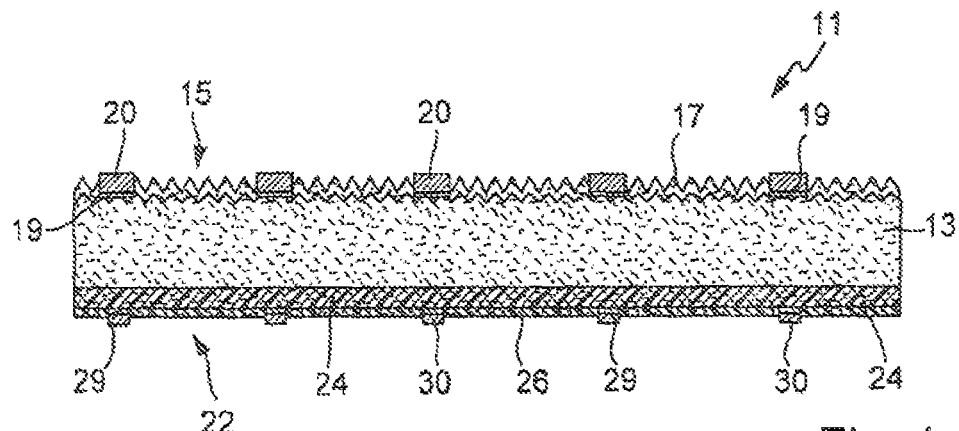
FIG. 1 A section through a solar cell manufactured according to a first development of the inventive method with an areal aluminium back surface field, the pure aluminium having been removed.

FIG. 1 shows a solar cell 11 comprising a p-doped silicon substrate 13. An antireflection coating 17, for example of SiN:H is applied to the front side 15 of substrate 13 and a not shown passivation of the underlying substrate 13 has taken place. Onto the front side 15 have been applied contacts in trenches in the antireflection coating 17 and comprise a lower nickel contact 19 and a silver contact 20 applied to the latter. The corresponding trenches in the antireflection coating 17 for contacts 19 and 20 can be produced by etching, or alternatively by mechanical working or laser machining. The nickel contacts 19 can be applied by so-called electro-less plating, whereas the silver contacts 20 can be applied in a LIP process. Contacts 18 and 20 are linear and are placed directly on an underlying silicon coating of substrate 13.

To a back side 22 of solar cell 11 an aluminium back surface field or aluminium BSF 24 is applied in areal manner from below to the silicon substrate 13. As described hereinbefore, the aluminium can be applied using a screen printing process or some other process. Prior to an alloying or burning into the silicon an intermediate drying step can take place. Alloying in can take place in a furnace, by irradiating with light or by heating.

In the case of the solar cell 11 according to FIG. 1, the surface-applied, more or less pure aluminium which has not been alloyed into the silicon is removed, advantageously via an etching step. The great advantage is that the AlSi alloy left in the aluminium-BSF 24 is transparent and in this way a bifacial solar cell 11 can be created, which functions on the back side 22 even in the case of light incidence. A further advantage is that through the use of aluminium the doping in of boron or boron itself can be avoided. Thus, aluminium can be more easily handled than boron, inter alia through lower temperatures for application and alloying in. Yet another advantage is the aforementioned possibility of using it combined with transparent, conductive oxides (TCO), i.e. in general such a TCO can be used instead of aluminium.

To the aluminum-BSF 24 is applied a further antireflection coating 26. Into said coating 26 is again introduced a contact, advantageously in the same way as to the front side 15 or firstly a nickel contact 29 and then a silver contact 30.

Figure 2:
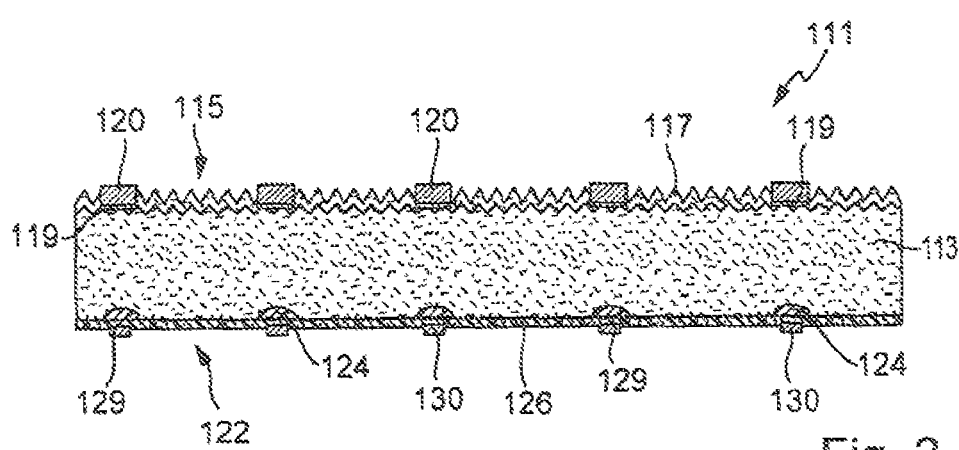
FIG. 2 A second development of a solar cell according to FIG. 1 with a linear aluminium back surface field, where once again the pure aluminium has been removed.

FIG. 2 shows an alternative solar cell 111, manufactured using an alternative method. An antireflection coating 117 is applied to a front side 115 of silicon substrate 113, much as described relative to FIG. 1. It is separated by grid-like patterns or opened down to the substrate 113 and firstly nickel contacts 119 and then silver contacts 120 are applied. Thus, a nickel contact can be applied by chemical metallization.

Diverging from the representation in FIG. 1, to a back surface 122 aluminium is applied solely in punctiform manner, i.e. in small areas or lines and not in large-area manner as in FIG. 1. However, the aluminium application can take place as described hereinbefore. Subsequently and for example following alloying in and much as described relative to FIG. 1, excess or pure aluminium is etched away and the small areas of the aluminium back surface field 124 are left. In a back-applied antireflection coating 126 over the aluminium-BSF 124 a structure is made or the latter is opened, for example by etching or mechanical working. Then, as described hereinbefore, firstly a nickel contact 129 and then to the latter a silver contact 130 is applied. The aluminium-BSF 124 in the solar cell 111 according to FIG. 2 is transparent. It is also restricted to a much smaller surface area than with the solar cell 11 of FIG. 1.

Figure 3:
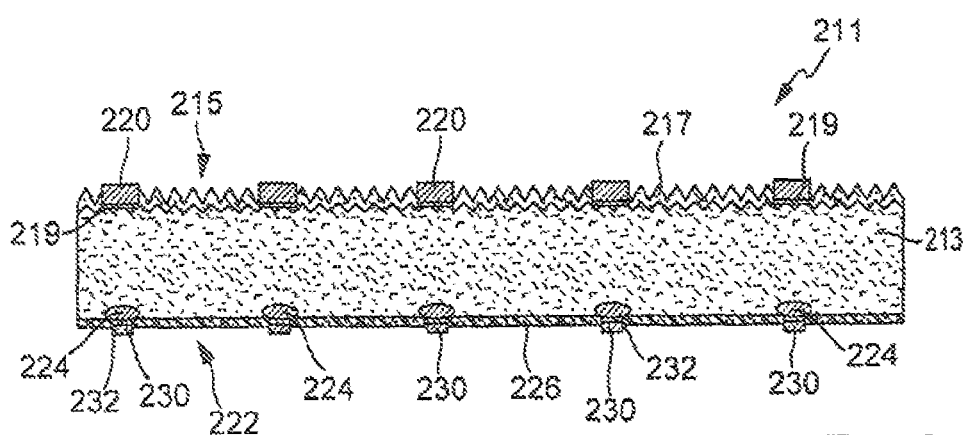
FIG. 3 A third development of a solar cell similar to FIG. 2, but where the pure aluminium has not been removed.

Finally, FIG. 3 shows a further solar cell 211, which once again has a somewhat different construction. As described hereinbefore, on a front side 215 there is once again an antireflection coating 217, lower nickel contact 219 and upper silver contact 220. However, on a back surface 222 and admittedly in the manner described hereinbefore, application takes place of aluminium for a linear or punctiform aluminium BSF 224 and is alloyed info the silicon. However, unlike what has been described hereinbefore, the pure aluminium is not removed and now instead forms a replacement for the lower nickel contacts according to FIGS. 1 or 2, namely as aluminium contact 232 and to which is applied a lower silver contact 230. A difference between solar cell 211 of FIG. 3 and solar cell 111 of FIG. 2 is consequently that following the alloying in of the aluminium for producing the aluminium-BSF, the remaining, pure aluminium is not removed and instead forms a replacement for the lower nickel contact. Thus, much as in the case of solar cell 11 according to FIG. 1, solar cell 211 can be manufactured relatively easily.

Prior to the application of the different coatings shown in the drawings, for example the application of aluminium for the aluminium-BSF, prior substrate treatments can take place. Thus, a silicon wafer can be textured and/or etched for optimizing the surface and eliminating saw damage. There is also a phosphorus doping for emitter formation. There can also be a further method step for the treatment of solar cells, for example a toughening.

In the case of the inventive solar cells described, it is possible to use multi-crystalline silicon material. This was previously impossible, because on alloying in with boron higher temperatures were needed and would have destroyed the multi-crystalline silicon. For the alloying of aluminium the temperature can be kept well below 900° C. Thus, within the scope of the invention, it is also possible to use multi-crystalline silicon material for the substrate. Soldering as an electrical terminal is also possible on the exposed silver contacts.

The invention claimed is:

1. A method for the manufacture of a solar cell with a BSF coating, comprising:
    applying a BSF coating to a back surface of a solar cell substrate through application of aluminium or TCO to said substrate and subsequent alloying into said substrate, said BSF coating being transparent for light; and
    following said alloying step into said substrate, removing only aluminium from an aluminium coating or pure aluminium, wherein solely said aluminium not alloyed into said substrate is removed.

2. The method according to claim 1, wherein said aluminium or said TCO is applied to said substrate in punctiform manner or in small areas.

3. The method according to claim 1, wherein a local production of several said BSF's in punctiform manner or in small areas is provided, said points or small areas being located along straight lines, which have a constant spacing and to which subsequently linear, metallic contacts are applied.

4. The method according to claim 1, wherein said aluminium or said TCO is applied in linear manner to said substrate.

5. The method according to claim 1, wherein said aluminium is applied in a spread out manner onto said substrate for a spread out BSF.

6. The method according to claim 1, wherein said entire area of one side of said substrate is covered.

7. The method according to claim 1, wherein said aluminium or said TCO is applied to said substrate by a screen printing process.

8. The method according to claim 1, wherein said aluminium or said TCO is applied in liquid or pasty from.

9. The method according to claim 1, wherein said aluminium or said TCO is applied by sputtering, vaporizing, CVD process or alloying.

10. The method according to claim 1, wherein said alloying of said aluminium into said substrate or said substrate silicon material takes place through heating which is separate from said aluminium application.

11. The method according to claim 1, wherein all said aluminium not alloyed in or not alloyed with said silicon material is removed.

12. The method according to claim 1, wherein said aluminium is removed by etching.

13. The method according to claim 1, wherein following said aluminium removal a passivation takes place and then an antireflection coating is applied to said back surface of said substrate.

14. The method according to claim 1, wherein following aluminium removal a p-n junction is produced by diffusion of phosphorus into said n-silicon of said substrate.

15. The method according to claim 1, wherein said aluminium is applied by a screen printing process on said substrate into prefabricated structures, said structures being through an antireflection coating down to said substrate, wherein subsequently said aluminium is not removed.

* * * * *